United States Patent [19]

Fujikawa

[11] Patent Number: 4,828,963

[45] Date of Patent: May 9, 1989

[54] PRINTING PLATE HAVING PHOTOSENSITIVE POLYMER COMPOSITION

[75] Inventor: Junichi Fujikawa, Kyoto, Japan

[73] Assignee: Toray Industries, Inc., Tokyo, Japan

[21] Appl. No.: 135,530

[22] Filed: Dec. 17, 1987

Related U.S. Application Data

[63] Continuation of Ser. No. 813,611, Dec. 26, 1985, abandoned, which is a continuation of Ser. No. 719,636, Apr. 4, 1985, Pat. No. 4,621,044, which is a continuation of Ser. No. 445,696, Dec. 1, 1982, abandoned.

[30] Foreign Application Priority Data

Dec. 10, 1981 [JP] Japan ............................. 56-198869
Jan. 26, 1982 [JP] Japan ............................. 57-9539

[51] Int. Cl.$^4$ ............................................. G03C 1/71
[52] U.S. Cl. ...................................... 430/285; 430/288; 430/909; 430/300; 430/281; 522/121; 522/117
[58] Field of Search ............... 430/909, 288, 285, 300, 430/281; 522/121, 117

[56] References Cited

U.S. PATENT DOCUMENTS

| | | | |
|---|---|---|---|
| 3,261,686 | 7/1966 | Celeste | 430/908 X |
| 3,485,733 | 12/1969 | D'Alelio | 204/159.18 |
| 3,630,746 | 1/1969 | Takimoto et al. | 430/281 |
| 3,801,328 | 4/1974 | Takimoto et al. | 430/909 X |
| 3,905,819 | 9/1975 | Sakurai et al. | 96/35.1 |
| 4,042,386 | 8/1977 | Okai et al. | 430/300 X |
| 4,247,624 | 1/1981 | Foss | 430/906 X |
| 4,272,611 | 6/1981 | Vyvial et al. | 430/306 |
| 4,481,280 | 11/1984 | Fujikawa et al. | 430/288 X |

FOREIGN PATENT DOCUMENTS

834337 5/1960 United Kingdom ............... 430/909

OTHER PUBLICATIONS

K. Toyoshima, Chapter 14, "Properties of Polyvinyl Alcohol Films", C. A. Finch, ed., Polyvinyl Alcohol: Properties and Applications, John Wiley & Sons, New York, N.Y., 1973, pp. 339–388.

Mori et al., Japan Kokai Tokkyo Koho, 79,138,091, 26 Oct. 1979, Chemical Abstracts, vol. 92, 1980, 92:138677g.

C. A. Finch (ed.), Polyvinyl Alcohol: Properties and Applications, (John Wiley & Sons Ltd. Bristol, Great Britian), 1973, pp. 22–23, 352–362.

Primary Examiner—Paul R. Michl
Assistant Examiner—Cynthia Hamilton
Attorney, Agent, or Firm—Austin R. Miller

[57] ABSTRACT

A printing plate having a photosensitive layer formed of a photosensitive polymer composition including the following components A, B, and C:

A. 100 parts by weight of partially saponified polyvinyl acetate having a saponification degree of 60 to 99 mole %;

B. 20 to 200 parts by weight of polyfunctional acrylate or methacrylate having a molecular weight of not more than 2000 and having at least two acryloyl or methacryloyl groups in the same molecule thereof and a number of a hydroxyl group or groups not more than the number of said acryloyl and methacryloyl groups in the same molecule thereof; and C. 1 to 60 parts by weight of a saturated compound having a molecular weight of not more than 1000 and a boiling point of not less than 150° C. and having at least one hydroxyl group in the molecule thereof.

10 Claims, No Drawings

PRINTING PLATE HAVING PHOTOSENSITIVE POLYMER COMPOSITION

This application is a continuation of application Ser. No. 813,611, filed Dec. 26, 1985, now abandoned, which is a continuation of Ser. No. 719,636, filed Apr. 4, 1985, now U.S. Pat. No. 4,621,044, which is a continuation of Ser. No. 445,696, filed Dec. 1, 1982, now abandoned.

BACKGROUND OF THE INVENTION

1. Field of the Invention

The present invention relates to printing plates with a water-developable photosensitive polymer composition having a high (or excellent) image-reproducibility and flexibility.

2. Description of the Prior Art

Photosensitive polymer printing plates having structure in which a photopolymerizable photosensitive polymer layer is formed on a metallic or plastic support have recently come into commercial use for relief-printing, lithography, and gravure printing. In using these printing plates, a negative or positive image-bearing film having transparent portions is placed closely against the photosensitive polymer layer, then irradiated with activating light. The portions of the photosensitive polymer layer corresponding to the transparent portions of the image-bearing film are thus photopolymerized. The unpolymerized portions of the photosensitive polymer layer are removed with an appropriate solvent. As a result, the desired relief image is formed on the support.

Photopolymerizable photosensitive polymer compositions are also used for numerous other applications in addition to the above-mentioned printing plates. Of these photosensitive Polymer compositions, those using partially saponified polyvinyl acetate as a base polymer have been proposed. Partially saponified polyvinyl acetate offers the advantage that unpolymerized portions thereof can be removed by neutral water.

Known examples of these photosensitive polymer compositions can be divided into two groups. The first group consists of those where the desired photosensitivity is provided by mixing the partially saponified polyvinyl acetate with a photopolymerizable unsaturated monomer mainly containly monofunctional acrylate or methacrylate having a hydroxyl group. These known photosensitive polymer compositions are disclosed in, for example, Japanese Examined Patent Publication (Kokoku) Nos. 46-39401, 50-3041, and 52-27561 and Japanese Unexamined Patent Publication (Kokai) Nos. 48-87903 and 50-27602.

The second group consists of those where the desired photosensitivity is provided by reacting a compound having an unsaturated group with the hydroxyl groups of the partially saponified polyvinyl acetate. These known photosensitive polymer compositions are disclosed in, for example, Japanese Examined Patent Publication Nos. 48-6962 and 49-5923 and Japanese Unexamined Patent Publication Nos. 48-55282, 48-65292, 48-66151, 50-30602, 50-45087, and 54-138090.

For instance, in the above-mentioned first group, it has been proposed to use monofunctional acrylate (i.e., an acrylic acid ester) or methacrylate (i.e., a methacrylic acid ester) having a hydroxyl group and one unsaturated group, such as $\beta$-hydroxyethyl acrylate or methacrylate or such as $\beta$-hydroxypropyl acrylate or methacrylate, as a main photopolymerizable monomer. These monofunctional unsaturated monomers have extremely good compatibility with partially saponified polyvinyl acetate. Therefore, these monofunctional unsaturated monomers function to improve the compatibility of polyfunctional acrylates or methacrylates having poor compatibility with partially saponified polyvinyl acetate and benzoin alkyl ether type photoinitiators having poor compatibility with partially saponified polyvinyl acetate.

However, to obtain satisfactory compatibility of the above-mentioned polyfunctional acrylates or methacrylates and the above-mentioned photoinitiators, a large amount of the above-mentioned monofunctional unsaturated monomers having a hydroxyl group or groups must be used. In such case, the crosslinking structure of the resultant polymer formed by photopolymerization would have a relatively low three-dimensional property due to the fact the polymer would be mainly formed by the monofunctional unsaturated monomers. This results in the disadvantages of insufficient water resistance of the photoinsolubilized portions and inability to obtain the desirable high image-reproducibility due to dissolution of minute image portions into water during water development. For these reasons, these photosensitive polymer compositions cannot easily be used for high-class printing plates requiring high image-reproducibility.

To eliminate these disadvantages, Japanese Unexamined Patent Publication No. 59-27602 proposes use of polyfunctional unsaturated monomers having two or more unsaturated groups and a number of hydroxyl groups more than the number of the unsaturated groups in the same molecule thereof. Since these polyfunctional unsaturated monomers have three or more hydroxyl groups, they have good compatibility with partially saponified polyvinyl acetate. Further, the density of the crosslinking structure obtained from these polyfunctional unsaturated monomers by photopolymerization is high. However, since an excess amount of the hydroxyl groups are bonded to the crosslinking structure, the resultant polymer has a strong hydrophilic property and poor water resistance. Thus, the photocured portions still partially dissolve in water during water development and these photosensitive polymers still cannot easily be used for high-class printing plates requiring high image-reproducibility.

As mentioned above, therefore, known photosensitive compositions where the photosensitivity is provided by mixing photopolymerizable unsaturated monomers with partially saponified polyvinyl acetate have insufficient water resistance of the photoinsolubilized portions and, therefore, cannot easily be used for printing plates requiring high image- reproducibility.

On the other hand, in the above-mentioned second group, where the desired photosensitivity is provided by incorporating an unsaturated group into partially saponified polyvinyl acetate, Japanese Examined Patent Publication No. 48-6962 and Japanese Unexamined Patent Publication Nos. 48-66151 and 50-45087 disclose incorporation of the unsaturated group into the partially saponified polyvinyl acetate by reacting the same with maleic acid or derivatives thereof. Furthermore, Japanese Unexamined Patent Publication No. 48-55282 discloses use of a cinnamic acid ester for incorporating the unsaturated group into the partially saponified polyvinyl acetate and Japanese Unexamined Patent Publication No. 48-65292 discloses use of an unsaturated lactone for incorporating the unsaturated group into the partially saponified polyvinyl acetate. However, in order to obtain satisfactory image-reproducibility only by the incorporation of the above-mentioned unsaturated groups into the partially saponified polyvinyl acetate, incorporation of a large amount of the unsaturated groups is required. The increase in the amount of the unsaturated groups incorporated results in a remarkable decrease in the amount of the hydroxyl groups, by which the water-solubility is afforded to the partially saponified polyvinyl acetate. This is because the compounds having the above-mentioned unsaturated group are incorporated into the partially saponified polyvinyl acetate by reaction thereof with the hydroxyl groups of the partially saponified polyvinyl acetate. The remarkable decrease in the amount of the hydroxyl groups in the partially saponified polyvinyl acetate causes a remarkable decrease in the water-development. Thus, the desirable balance of good image-reproducibility and good water-development cannot be accomplished by these prior compositions.

To eliminate these disadvantages, Japanese Examined Patent Publication No. 49-5923 proposes a composition of a photo-polymerizable acrylate together with a partially saponified polyvinyl acetate having the unsaturated group incorporated by reaction with N-methylolacrylamide. Furthermore, Japanese Unexamined Patent Publication No. 54-138090 proposes a composition of a photopolymerizable acrylate together with a partially saponified polyvinyl acetate having the unsaturated group incorporated by reaction with an unsaturated aldehyde such as acrolein.

However, since the unsaturated group incorporated into the partially saponified polyvinyl acetate is neither an acryloyl group nor a methacryloyl group, its ability to copolymerize with the acryloyl group or the methacryloyl group of the photopolymerizable monomer is remarkably poor. Thus, the possibility or probability of chemically bonding the partially saponified polyvinyl acetate to the crosslinked structure formed by the polymerization of the copolymerizable monomer is very low. Accordingly, the expected improvement in the image reproducibility is not achieved.

SUMMARY OF THE INVENTION

The object of the present invention is to provide a printing plate with a photosensitive layer formed of a photosensitive polymer composition having an extremely high image reproducibility and containing, as a base polymer, partially saponified polyvinyl acetate capable of developing by neutral water.

More specifically, the object of the present invention is to provide such printing plate having a water-developable photosensitive polymer composition used to produce a photosensitive layer of the water-developable relief image printing plate on a gravure plate.

In accordance with the present invention, there is provided a printing plate having a photosensitive polymer composition comprising:

A. 100 parts by weight of partially saponified polyvinyl acetate having a saponification degree of 60 to 99 mole %;

B. 20 to 200 parts by weight of polyfunctional acrylate or methacrylate having a molecular weight of not more than 2000 and having at least two acryloyl or methacryloyl groups in the same molecule thereof and a number of a hydroxyl group or groups not more than the number of the acryloyl and methacryloyl groups in the same molecule thereof; and C. 1 to 60 parts by weight of a saturated compound having a molecular weight of not more than 1000 and a boiling point of not less than 150° C. and having at least one hydroxyl group in the molecule thereof.

DESCRIPTION OF THE PREFERRED EMBODIMENT

The partially saponified polyvinyl acetates usable as component A of the photosensitive composition layered on the printing plate of the present invention are those having a saponification degree of 60 to 99 mole %. Partially saponified polyvinyl acetates having a saponification degree of less than 60 mole % have a remarkably decreased water-solubility, which renders the water development impossible.

Contrary to this, partially saponified polyvinyl acetates having a saponification degree of more than 99 mole % have poor solubility in water at an ambient temperature and a remarkably poor compatibility with component B of the photosensitive composition used to make the photosensitive layer portion of the printing plate of the present invention. For the abovementioned reasons, the saponification degree of the partially saponified polyvinyl acetate used as component A of the composition should be within the range of from 60 to 99 mole % and, desirably, 70 to 90 mole % in view of both the water-solubility and the compatibility with component B.

Partially saponified polyvinyl acetates having any molecular weight can be used in the present invention. However, those having a polymerization degree of 200 to 2000 are desirably used in view of the compatibility with component B and the water-solubility.

Partially saponified polyvinyl acetates having different saponification degrees and molecular weights can be used alone or in any mixture thereof.

Furthermore, the partially saponified polyvinyl acetates having a terminal double-bond obtained by reacting an unsaturated epoxy compound such as glycidyl methacrylate with the terminal carboxy group of the partially saponified polyvinyl acetate of component A, the partially saponified polyvinyl acetates having a minor amount within the range of from 1 to 10 mole % of other monomers such as allylsulfonic acid copolymerized therewith, and the modified partially saponified polyvinyl acetates obtained by reacting the hydroxyl groups thereof with ethylene oxide can also be used as component A of the present inention as long as the saponification degree is within the range of from 60 to 99 mole % based on the remaining hydroxyl group thereof. Especially, the use of the partially saponified polyvinyl acetate having the terminal double bond obtained by reacting glycidyl methacrylate with the terminal group of the partially saponified polyvinyl acetate desirably results in the photosensitive polymer composition having an especially high image-reproducibility because the partially saponified polyvinyl acetate per se is chemically incorporated into the crosslinked structure formed by the photopolymerization thereof with the polyfunctional acrylate or methacrylate of component B of the present invention.

Furthermore, other polymers, for example, cellulose derivatives such as methyl cellulose having a polymerization degree of 300 to 3000, polyethylene oxides having a molecular weight of 1000 to 50,000, ring opening polymers of α-(N-dimethylamino)-ε-caprolactam having an intrinsic viscosity of 0.5 to 5.0 determined in a solution of 1 g of the polymer dissolved in 100 ml of concentrated sulfuric acid at 25° C., and ring opening copolymers of α-(N-dimethylamino)-ε-caprolactam and ε-caprolactam having the same intrinsic viscosity as that of the above-mentioned ring opening polymers can be used as the mixture thereof with the above-mentioned partially saponified polyvinyl acetate including a small amount within the range of from 1% to 20% by weight of the other polymers. Especially, the ring opening copolymers obtained by ring opening copolymerizing 10% to 50% by weight of ε-caprolactam with α-(N-dimethylamino)-ε-caprolactam is desirably used since these copolymers can improve the compatibility of the partially saponified polyvinyl acetate with the polyfunctional acrylates or methacrylates of component B of the present invention.

Component B used in the photosensitive composition is a polyfunctional acrylate or methacrylate having a molecular weight of not more than 2000 and having at least two acryloyl or methacryloyl groups in the same molecule thereof and a number of hydroxyl group or groups not more than the number of the acryloyl or methacryloyl groups in the same molecule thereof. Although there is no critical limitation to the number of carbon atoms of the polyfunctional acrylate or methacrylate, acrylates or methacrylates having 6 to 40 carbon atoms are desirably used. Examples of such acrylates and methacrylates are polyfunctional acrylates and methacrylates having 1 to 2 hydroxyl groups obtained by reacting (i) 2 to 3 hydroxyl groups of polyhydric alcohols having 2 to 30 carbon atoms and 3 to 4 hydroxyl groups with (ii) acrylic or methacrylic acid, such as glycerol diacrylate, glycerol dimethacrylate, trimethylolpropane diacrylate, trimethylolpropane dimethacrylate, pentaerythritol diacrylate, pentaerythritol dimethacrylate, pentaerythritol triacrylate, pentaerythritol trimethacrylate, trimethylolethane diacrylate, trimethylolethane dimethacrylate, and tetramethylolethane triacrylate, tetramethylolethane trimethacrylate; polyfunctional acrylates or methacrylates having 2 to 5 acryloyl or methacryloyl groups and the same number of hydroxyl groups obtained by (i) the reaction of an epoxy group or groups contained in glycidyl ethers of polyhydric alcohols having 2 to 30 carbon atoms and 2 to 5 hydroxyl groups (e.g., ethylene glycol diglycidyl ether or propylene glycol diglycidyl ether) with (ii) an active hydrogen atom or atoms contained in unsaturated carboxylic acids having 3 to 15 carbon atoms (e.g., acrylic acid or methacrylic acid); polyfunctional acrylates or methacrylates having 2 to 5 acryloyl or methacryloyl groups and the same number of hydroxyl groups obtained by the addition reaction of (i) unsaturated alcohols having 4 to 15 carbon atoms (e.g., β-hydroxyethyl acrylate or β-hydroxyethyl methacrylate) and (ii) glycidyl ethers or polyhydric alcohols having 2 to 30 carbon atoms and 2 to 5 hydroxyl groups; and polyfunctional acrylates or methacrylates having 2 or more acryloyl groups or methacryloyl groups and having a number, not more than the number of the acryloyl or methacryloyl groups, of hydroxyl groups obtained by the addition reaction of (i) epoxy compounds having acryloyl or methacryloyl groups with 4 to 15 carbon atoms (e.g., glycidyl methacrylate) 4 to 15 carbon atoms (e.g., glycidyl methacrylate) and (ii) compounds having an active hydrogen atom or atoms such as unsaturated carboxylic acids having 2 to 30 carbon atoms, polyfunctional saturated carboxylic acids having 2 to 30 carbon atoms and 2 to 5 hydroxyl groups, unsaturated alcohols having 2 to 30 carbon atoms, polyhydric alcohols having 2 to 30 carbon atoms and 2 to 5 hydroxyl groups, or primary or secondary amines having 2 to 30 carbon atoms. Of these polyfunctional acrylates and methacrylates, the reaction products of acrylic or methacrylic acid and glycidyl methacrylate, the reaction products of acrylic or methacrylic acid and ethylene glycol diglycidyl ether, and the reaction products of acrylic or methacrylic acid and propylene glycol diglycidyl ether are most desirably used as component B of the present invention from the viewpoints of the compatibility thereof with the partially saponified polyvinyl acetate of the component A and the photopolymerization properties thereof. The above-mentioned compounds can be used alone or in any mixture thereof as component B of the present invention.

These compounds of component B exhibit certain compatibility with the above-mentioned partially saponified polyvinyl acetates, which are hydrophilic polymers, since the component B has a hydroxyl group or groups in the molecule thereof. Furthermore, since component B has two or more acryloyl or methacryloyl groups, crosslinked structures having sufficient three-dimensional property are formed by photopolymerization of component B. Thus, the density of the resultant crosslinked structure becomes very high. In addition, since the number of the hydroxyl groups is not more than that of the acryloyl or methacryloyl groups, the decrease in the water-resistant property of the formed crosslinked structure due to the excessive hydroxyl groups can also be effectively prevented. Furthermore, when a methacryloyl group is introduced into the end portion of the partially saponified polyvinyl acetate by reactions thereof with glycidyl methacrylate, component A of the present invention is incorporated through chemical bonding into the crosslinked structure formed by the photopolymerization of component B because the acryloyl or methacryloyl group of component B is readily copolymerized with the terminal methacryloyl group of the partially saponified polyvinyl acetate. For this reason, the water resistance of the photoinsolubilized portions and, therefore, the image reproducibility are further improved.

Component B should be used in an amount of 20 to 200 parts by weight, based on 100 parts by weight of component A. The use of component B in an amount of less than about 20 parts by weight results in the formation of a crosslinked structure having an insufficient density by photopolymerization whereby good image reproducibility cannot be obtained. Contrary to this, the use of component B in an amount of more than 200 parts by weight results in the formation of the extra-dense crosslinked structure by photopolymerization, whereby remarkable problems occur in that the image portion becomes brittle and undesirable cracks are generated. Accordingly, the amount of component B used in the present composition should be 20 to 200 parts by weight, desirably 50 to 150 parts by weight, based on 100 parts by weight of component A.

Component B has a certain compatibility with component A since component B has a hydroxyl group or groups in the molecule thereof. However, the compatibility of component B with component A tends to remarkably or suddenly decrease when the molecular weight of component B is more than 2000. Accordingly, the molecular weight of component B should be not more than 200.

The compounds usable as component C in the present invention are those having a molecular weight of not more than 1000 and a boiling point of not less than 150° C. Examples of such compounds are monohydric higher alcohols having 5 to 20 carbon atoms such as furfuryl alcohol, n-heptyl alcohol, isoheptyl alcohol, n-octyl alcohol, isooctyl alcohol, n-decyl alcohol, benzyl alcohol, and 2-methyl cyclohexanol; dihydric alcohols and their derivatives such as ethylene glycol, butyl cellosolve, phenyl cellosolve, hexyl cellosolve, 2-(methoxymethyl)ethanol, diethylene glycol, methyl carbitol, ethyl carbitol, butyl carbitol, diethylene glycol monoacetate, triethylene glycol, triethylene glycol, monomethyl ether, triethylene glycol monoethyl ether, tetraethylene glycol, propylene glycol, dipropylene glycol, polyethylene glycol having a molecular weight of 1000 or less, polypropylene glycol having a molecular weight of less than 1000, 1,3-butanediol, and 1,5-pentanediol; tri- or tetra-hydric alcohols and their derivatives such as glycerine, glyceryl monoacetate, glyceryl monobutyrate, glyceryl dibutyrate, diglycerine, trimethylol-ethane, trimethylol-propane, hexanetriol, and tetramethylol-methane; and amines having a hydroxyl group or groups and 2 to 20 carbon atoms such as monoethanolamine, diethanol-amine and triethanol-amine. Of these compounds, ethylene glycol, diethylene glycol, triethylene glycol, glycerine, diglycerine, trimethylol ethane, and trimethylol-propane are desirable due to the extremely high compatibility with the above-mentioned components A and B, because these compounds have 2 or 3 hydroxyl groups in the molecule and a high hydroxyl density (i.e., a molecular weight per hydroxyl group of 100 or less). The above-mentioned compounds can be used alone or in any mixture thereof as component C in the present invention.

The molecular weight of component C should be not more than 1000. Compounds having a molecular weight of more than 1000 suffer from remarkably decreased compatibility with components A and B, even though they have hydroxyl groups in the molecule. Thus, they cannot achieve the intended function of component C, i.e., to improve the compatibility of component A with B. For the above-mentioned reasons, the molecular weight of component C should be not more than 1000, desirably 50 to 500.

The mechanism of the improvement in the compatibility of component A with component B by the use of component C would seem, without prejudice to the present invention, to be as follows: That is, component B has a certain compatibility with the hydrophilic partially saponified polyvinyl acetate (i.e., component A) since component B has a hydroxyl group or groups in the molecule. However, the compatibility is not sufficient and, therefore, there occur problems in that a portion of component B bleeds out on the surface of the printing plate and phase separation between components A and B often occurs in the inside of the printing plate, generating turbidity in the printing plate, when, for example, the solvent is rapidly removed from the printing plate or the printing plate is rapidly cooled down during the formation of the printing plate. Furthermore, a portion of component B sometimes generally bleeds out from the printing plate when the printing plate is stored under a high humidity condition for a long time. However, when component C is mixed with a composition including components A and B, the above-mentioned problems are solved by improving the compatibility of component A with component B because component C has the desired compatibility with both components A and B due to the presence of the hydroxyl group. Furthermore, the ability to mold the composition during the formation or production of the printing plate is improved by the addition of component C. Still furthermore, when n-octyl alcohol and similar compounds are used as component C, a defoaming effect is also expected during water-developing.

Generally speaking, it is common that, when low-molecular weight saturated compounds similar to those of component C in the present invention are mixed with a photosensitive polymer composition, the ability to photopolymerize becomes worse and the image-reproducibility remarkably decreases. Contrary to this, according to the present invention, since the above-mentioned polyfunctional acrylates or methacrylates having two or more acryloyl or methcryloyl groups are used as component B, the crosslinked structure formed by photopolymerizati has satisfactory three-dimensional properties and extremely high density. Furthermore, since the formed crosslinked structure does not have excess hydroxyl groups, the water resistance of the photopolymerized portion is excellent. Accordingly, even when low-molecular weight saturated compounds of component C are contained in a relatively large amount in the photosensitive polymer composition, the decrease in the water resistant property of the photopolymerized portion is very small and the desired high image-reproducibility can be retained.

As mentioned above, the boiling point of component C should be not less than 150° C. If the boiling point of component C is less than 150° C., the intended function to improve the compatibility of component A with component B cannot be effected, since component C only acts as a solvent of the photosensitive polymer compositions and is removed from the printing plate during, for example, the drying step in the formation of the printing plate. Furthermore, if the boiling point of component C is less than 150° C., the hardness of the printing plate is remarkably decreased with the lapse of time since a portion of component C is vaporized with the lapse of time when a portion of component C remains in the inside of the printing plate. For these reasons, the boiling point of component C should be not less than 150° C. The upper limit of the boiling point of component C cannot be specifically defined, since there are compounds having no substantial boiling point near 300° C. due to the occurrence of thermal degradation of the molecules.

Since component C of the present invention has a boiling point of 150° C. or more, all of the major portions thereof remain in the inside of the printing plate of the invention derived from the photosensitive composition. Accordingly, component C of the present invention also functions to afford flexibility to the exposed printing plate. Thus, the problem of cracks in the exposed printing plate in cold atmosphere, as in conventional partially saponified polyvinyl acetate, can be solved. Furthermore, since the relief portion becomes soft due to the, presence of component C, the ink-transfer property during a printing step can be improved.

Component C should be used in an amount of 1 to 60 parts by weight, desirably 5 to 50 parts by weight, based on 100 parts by weight of component A, in the present invention. The use of component C in an amount of less than 1 part by weight based on 100 parts by weight of component A does not affect the intended function to improve the compatibility of component A with the component B. Contrary to this, the use of component C in an amount of more than 60 parts by weight results in a decrease in the water resistance and also results in a remarkable decrease in the image-reproducibility.

Photosensitizers usable for rapidly effecting the photopolymerization reaction of the photosensitive composition used in making the photosensitive layer portion of the printing plate of the invention may be any conventional compounds. Examples of such compounds are benzoin alkyl ether type compounds, benzophenone type compounds, anthraquinone type compounds, benzyl type compounds, acetophenone type compounds, and diacetyl type compounds. These photosensitizers are generally used in an amount of 0.01% to 10% by weight based on the total weight of the composition.

In order to increase the thermal stability of the photosensitive composition, any conventional thermal polymerization inhibitor can be used. Examples of the desirable thermal polymerization inhibitors are phenolic compounds, hydroquinone type compounds, and catechol type compounds. These inhibitors are generally used in an amount of 0.001% to 5% by weight based on the total weight of the composition. Furthermore, various conventional additives such as dyestuffs, pigments, surfactants, defoaming agents and ultraviolet light absorbents can be used in the photosensitive composition.

The photosensitive polymer composition used to make the photosensitive layer portion of the printing plate of the invention is prepared by, for example, dissolving the partially saponified polyvinyl acetate of component A in a mixed solvent of water/alcohol upon heating and, then, adding the polyfunctional acrylates or methacrylates of component B, the saturated compounds of component C having a hydroxyl group or groups, and additives such as the photosensitizer and thermal polymerization inhibitors to the solution. The resultant mixture is thoroughly mixed while stirring. Thus, the desired photosensitive polymer composition solution can be obtained.

The photosensitive layer of the printing plate of the invention can be formed from the present photosensitive polymer composition by, for example, distilling off most of the solvent from the composition and then pelletizing the resultant composition. The pelletized particles are deposited on a support by means of a press under heating and pressurizing conditions to form the photosensitive layer. Alternatively, the photosensitive layer can be prepared by forming a photosensitive sheet from the composition by using a dry film-forming method and, then, by adhering the resultant photosensitive sheet to a support to form a photosensitive layer. Furthermore, the photosensitive layer can be prepared by directly forming a photosensitive layer on a support by using a dry filmforming method. Supports usable in the production of the photosensitive layer are, for example, metal plates or sheets made from metals such as iron, stainless steel, aluminum, and copper; synthetic resin sheets such as polyester film; and synthetic rubber sheets such as styrene-butadiene sheets. The thickness of the photosensitive layer is desirably 0.1 to 10 mm.

The relief images for printing can be formed from the photosensitive resin composition by placing negative or positive image-bearing transparencies closely against the photosensitive layer as prepared above and, then, irradiating the photosensitive layer with ultraviolet light, mainly having a wavelength of 300 to 400 nm (nanometer) to effect insolubilization of the irradiated portions by photopolymerization. The ultraviolet light can be derived from, for example, a high pressure mercury lamp, a super-high pressure mercury lamp, a metal halide lamp, a xenon lamp, a carbon-arc lamp, or a chemical lamp. Thereafter, the non-insolubilized portions of the photosensitive layer are dissolved by neutral water in a spray-type developing apparatus or a brush-type developing apparatus to form a relief image on the suppport.

In order to facilitate the close contact of the negative or positive image-bearing transparencies against the photosensitive layer under vacuum, a film having a matte surface can be laminated on the surface of the photosensitive layer in such a manner that the matte surface is contacted with the surface of the photosensitive layer. Thus, the surface of the photosensitive layer is matted. In addition, the lamination of an anti-tacky layer having a thickness of 0.1 to 20 $\mu$m (micrometer) and consisting of entirely or partially saponified polyvinyl acetate having a saponification degree of 60 to 100 mole % on the surface of the photosensitive layer is also effective for improving close contact of the image-bearing transparency under vacuum. Furthermore, when the surface of the above-mentioned anti-tacky layer is matted, extremely excellent close contact under vacuum can be achieved.

The photosensitive polymer composition provides a photosensitive polymer printing plate capable of development with neutral water and having a high image-reproducibility suitable for use in a high-class printing application in which fine or minute images having 3% half-tone of 133 lines and 50 $\mu$m fine lines are required to be reproduced. This is because, according to the present invention, a partially saponified polyvinyl acetate having a good water-solubility (i.e., component A) is used as a base polymer, a polyfunctional acrylate or methacrylyate (i.e., component B) is used as a photopolymerizable monomer, and a saturated compound having a hydroxyl group is used as component C for improving the compatibility of component A with component B. That is, since component B has a hydroxyl group in the molecule thereof, it has a certain compatibility with component A (i.e., the partially saponified polyvinyl acetate). However, since the compatibility of component B with component A is not satisfactory, the above-mentioned phase-separation and bleeding out to the surface of the printing plate are often generated. These problems can be advantageously solved by the addition of component C. It is believed that the addition of component C results in the perfect compatibility of components A and B with each other since component C has the desired compatibility with both components A and B due to the function of the hydroxyl group contained in the molecule of component C. When a printing plate formed from the photosensitive polymer composition is irradiated by activating light, component B is rapidly and uniformly photopolymerized to form a crosslinked structure having a high density and component A is effectively and uniformly contained or included in the crosslinked structure formed by the photopolymerization of the polyfunctional acrylate or methacrylate of component B. Furthermore, since the crosslinked structure formed by the photopolymerization of component B is comprised of polyfunctional acrylate or methacrylate, the density thereof is extremely higher than that mainly obtained from monofunctional acrylate or methacrylate, and the water-resistance of the crosslinked structure per se is good due to the fact that the number of hydroxyl groups in component B is not more than that of the acryloyl or methacryloyl group in component B. Therefore, good water resistance of the photocured portion and high image-reproducibility can be obtained, even when the saturated compound of component C having a hydroxyl group is present. Furthermore, the inclusion of component C in the exposed printing plate affords flexibility to the exposed printing plate. As mentioned hereinbelow, components A, B and C are essential components for the photosensitive polymer composition, and the combined use of these components results in the desired high image-reproducibility and flexibility of the exposed printing plate.

A printing plate having a photosensitive layer prepared from the desired photosensitive composition can be most effectively used as a relief image printing plate, but can also be used as, for example, a lithographic plate, a gravure plate, a screen printing plate, and in photoresist processes.

EXAMPLES

The present invention will now be further illustrated by, but is by no means limited to, the following examples, in which all parts, percentages, and ratios are by weight unless otherwise indicated.

Example 1

One mole of propylene glycol diglicidyl ether and 2 moles of acrylic acid, 1% of triethylbenzyl ammonium chloride, and 0.1% of hydroquinone monomethyl ether were placed in a three-necked flask provided with stirrer and were reacted at a temperature of 80° C. for 8 hours under stirring, while nitrogen gas was passed through the flask.

The reaction product thus obtained was analyzed by an infrared absorption spectrum. As a result, it was observed that the resultant product was polyfunctional acrylate having two hydroxyl groups and two acryloyl groups as shown in the following formula:

drying was 950 μm. Then, the cast plate was placed in a blast oven at a temperature of 60° C. for 5 hours, whereby the solvent was completely removed therefrom. The photosensitive layer thus obtained was transparent and no bleeding-out of the monomer on the surface of the layer was observed.

On the surface of the photosensitive layer thus obtained, a mixed solvent of water/ethanol (50/50) was coated as a thin film and, then, a polyester film having a thickness of 100 μm was laminated under pressure to form a cover film. The resultant printing plate was stored in a dark place for 10 days.

The cover film over the printing plate was peeled off. Gray scale negative film (21 steps sensitivity guide manufactured by Stouffer Co., Ltd.) and image-reproducibility evaluation negative film (including 133 lines; 3%, 5% and 10% halftone; independent dots having 200 μm and 300 μm diameter; fine lines having 50 μm and 70 μm widths) were placed closely under vacuum against the photosensitive layer and the photosensitive layer was exposed for 2 minutes by a high pressure mercury lamp.

After the exposure, the printing plate was developed in a brush-type developing apparatus containing neutral water at a liquid temperature of 30° C. Non-image portions were completely dissolved into the water for a developing time of 2 minutes. Thus, a relief image was formed.

As a result of the evaluation of the relief image thus obtained, up to 16 steps remained in the gray scale portions, which indicated the high sensitivity of the printing plate. Furthermore, it was confirmed that fine portions such as the 3% half-tone, 200 μm independent dot, and 50 μm fine line were completely reproduced in the image portions. The hardness of the printing plate was a Shore D of 60.

The printing plate thus obtained was used in a printing test. As a result, prints having a sharp print were obtained without causing undue broadening of the image.

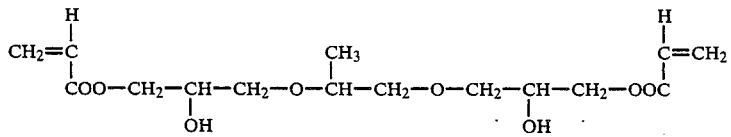

As component A, partially saponified polyvinyl acetate having a saponification degree of 80 mole % and a polymerization degree of 500 was selectd. One hundred parts of this partially saponified polyvinyl acetate was dissolved under heating in a mixed solvent of ethanol/water (50/50) at a temperature of 80° C. Then, 80 parts of the above-prepared difunctional acrylate, 20 parts of diethylene glycol, 2 parts of dimethylbenzyl ketal (i.e., photosensitizer), and 0.01 parts of hydroquinone (i.e., thermal polymerization inhibitor) were added and, then, the resultant mixture was thoroughly mixed.

The photosensitive polymer composition solution thus obtained was cast on a polyester film substrate having a thickness of 150 μm and having the previously coated polyester type adhesive layer in such a manner that the total thickness including the substrate after

Example 2

One mole of ethylene glycol diglycidyl ether and 2 moles of methacrylic acid, 1% of triethylbenzyl ammonium chloride, and 0.1% of hydroquinone monomethyl ether were placed in a three-necked flask provided with a stirrer. The mixture was reacted at a temperature of 80° C. for 8 hours under stirring, while nitrogen gas was passed through the flask.

The reaction product thus obtained was analyzed by an infrared absorption spectrum and was found to be methacrylate monomer having two hydroxyl groups and two methacryloyl groups as shown in the following formula:

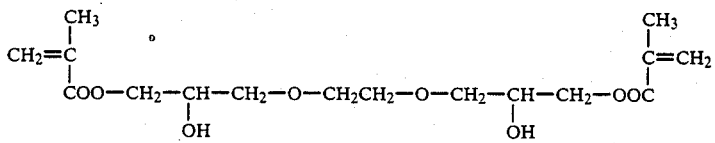

As component A, partially saponified polyvinyl acetate having a saponification degree of about 78 mole % and a polymerization degree of 500 was selected. Ninety-two parts of this partially saponified polyvinyl acetate were dissolved under heating in a mixed solvent of 60 parts of ethanol and 60 parts of water at a temperature of 80° C. for 1 hour. Then, 8 parts of glycidyl methacrylate was added thereto and the mixture was reacted at a temperature of 80° C. for 1 hour. The terminal portions of the saponified polyvinyl acetate were determined by a potentiometric titration method. As a result, it was found that the terminal carboxyl groups disappeared and methacryloyl groups were introduced to the terminal portions by the reaction with glycidyl methacrylate. The determination of the hydroxyl value and the infrared absorption spectrum indicated that no substantial change in the hydroxyl group occurred and no methacryloyl pendant group was introduced.

To the solution of the partially saponified polyvinyl acetate having the terminal methacryloyl groups thus obtained, 87 parts of the above-prepared photopolymerizable methacrylate having two hydroxyl groups and two methacryloyl groups, 10 parts of diethylene glycol, 3 parts of benzoin methyl ether (i.e., photosensitizer), and 0.1 part by weight of t-butylcatechol (i.e., thermal polymerization inhibitor), all based on 100 parts of the partially saponified polyvinyl acetate were added. Then, the resultant mixture was thoroughly mixed at a temperature of 80° C. for 1 hour. Thus, photosensitive polymer composition solution II-1 was obtained.

As a comparative example, a photosensitive polymer composition solution II-2 was obtained in the same manner as described above, except that the amount of the photopolymerizable monomer was increased to 97 parts and that no diethylene glycol was added.

The photosensitive polymer composition solution obtained above were cast on polyester films each having a thickness of 200 μm and having a previously coated polyester type adhesive layer in such a manner that the total thickness after drying was 500 μm. Then, the cast plate was dried in an oven at a temperature of 70° C. for 2 hours, whereby the solvent was completely removed therefrom.

In the photosensitive layer obtained from the photosensitive polymer composition solution II-2 containing no diethylene glycol, a bleeding-out phenomenon of the monomer on the dried surface of the photosensitive layer was observed. Contrary to this, such a phenomenon was not observed in the photosensitive layer obtained from the photosensitive polymer composition solution II-1. Thus, a good dried sheet was obtained from the photosensitive polymer composition solution II-1.

On the surface of the photosensitive layer thus obtained from the photosensitive polymer composition solution, a mixed solvent of water/ethanol (50/50) was coated as a thin film and, then, a polyester cover film having a thickness of 100 μm was laminated on the photosensitive layer. The resulting printing plate was stored in a dark place for 10 days.

The cover film was peeled off the printing plate. Gray scale negative film for determining sensitivity (21 steps sensitivity guide manufactured by Stouffer Co, Ltd.) and image-reproductivity evaluation negative film (including 150 μm lines; 3%, 5% and 10% half-tone; independent dots having 150 μm and 250 μm diameters; fine lines having 40 μm and 60 μm widths) were placed closely under vacuum against the photosensitive layer and the photosensitive layer was exposed for 1 minute by a high-pressure mercury lamp.

After the exposure, the printing plate was developed in a brush-type developing apparatus containing neutral water at a liquid temperature of 30° C. Non-image portions were completely dissolved into the water for a developing time of 1 minute. Thus, a relief image was obtained.

As a result of the evaluation of the relief image thus obtained, up to 16 steps remained in the scale portions, by which the high sensitivity of the printing plate was indicated. Furthermore, it was confirmed that fine portions such as the 3% half-tone, 150 μm independent dot, and 40 μm fine line were completely reproduced in the image portions. The hardness of the printing plate was a Shore D of 60.

The printing plate thus obtained was used in a printing test. As a result, prints having sharp finish were obtained without causing undue broadening of the image.

Example 3

One mole of glycidyl methacrylate and 1 mole of methacrylic acid, 1% of triphenyl phosphine and 0.1% of hydroquinone monomethyl ether were placed in a three-necked flask provided with a stirrer. The mixture was reacted at a temperature of 80° C. for 9 hours under stirring, while nitrogen gas was passed through the flask.

The reaction product thus obtained was analyzed by an infrared absorption spectrum and was found to be polyfunctional methacrylate having two unsaturated groups and one hydroxyl group as shown in the following formula:

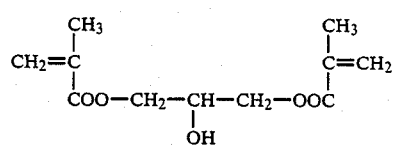

As component A, partially saponified polyvinyl acetate having a saponification degree of 90 and a polymerization degree of 800 was selected. 100 parts of this partially saponified polyviny acetate were dissolved in a mixed solvent of water/ethanol (60/40) at a temperature of 70° C. Then, to this solution, 90 parts of the difunctional methacrylate obtained above, 10 parts of ethylene glycol and 5 parts of benzophenone were added and the resultant mixture was thoroughly mixed while stirring.

The photosensitive polymer composition solution obtained above was cast on an aluminum substrate having a thickness of 350 μm and having a previously coated polyester type adhesive layer in such a manner that the total thickness (including the substrate) after drying was 700 μm. Then, the cast plate was dried in an oven at a temperature of 60° C. for 2 hours, whereby the solvent was completely removed therefrom.

After the resulting printing plate was stored at a dark place for 3 days, the same test negative film as used in Example 1 was placed closely under vacuum against the photosensitive layer and the photosensitive layer was exposed for 1 minute by a high pressure mercury lamp. After the exposure, the printing plate was developed in a spray type developing apparatus (water temperature 30° C., spray pressure 3 kg/cm$^2$) for 3 minutes to form a relief image.

As a result of the evaluation of the relief image thus obtained, up to 15 steps remained in the gray scale portions. Furthermore, it was confirmed that the 3% halftone, 200 μm independent dot and 50 μm fine line were satisfactorily reproduced in the image portions. The hardness of the printing plate was a Shore D of 72.

The printing plate thus obtained was used in a printing test. As a result, prints having sharp finish were obtained without causing undue broadening of the image. Furthermore, no problem such as generation of cracks in the printing plate was observed at all during the printing step.

Example 4

One mole of glycidyl methacrylate and 1 mole of acrylic acid, 1% of triethylbenzyl ammonium chloride and 0.01% of hydroquinone monomethyl ether were placed in a three-necked flask provided with a stirrer. The mixture was reacted at a temperature of 70° C. for 8 hours under stirring, while nitrogen gas was passed through the flask.

The reaction product thus obtained was analyzed by an infrared absorption spectrum and was found to be polyfunctional acrylate methacrylate having one hydroxyl group, one methacryloyl group and one acryloyl group as shown in the following formula:

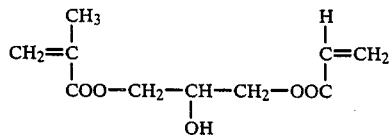

As component A, partially saponified polyvinyl acetate having a saponification degree of about 75 mole % and a polymerization degree of 1000 was selected. One hundred parts of this partially saponified polyvinyl acetate and 15 parts of a copolymer having an inherent viscosity of 2.3 obtained from the copolymerization of α-(N-dimethylamino)-ε-caprolactam/ε-caprolactam (70/30) were dissolved under heating in a mixed solvent of ethanol and water (50/50) at a temperature of 70° C. Then, 70 parts of the above-prepared polyfunctional acrylate methacrylate, 13 parts of trimethylolpropane and 2 parts of dimethylbenzyl ketal were added thereto and thoroughly mixed while stirring.

The photosensitive polymer composition solution obtained above was cast on a steel substrate having a thickness of 200 μm and having a previously coated adhesive layer in such a manner that the total thickness (including the substrate) after drying was 600 μm. The adhesive comprised partially saponified polyvinyl acetate, epoxy resin and phenol resin. Then, the cast plate was dried in a blast oven at a temperature of 60° C. for 3 hours, whereby the solvent was completely removed therefrom.

On the surface of the photosensitive layer obtained above, a mixed solvent of water/ethanol (50/50) was coated as a thin film and, then, a polyester film having a thickness of 100 μm and having a matte surface matted by chemical etching was laminated in such a manner that the matte surface was contacted with the surface of the photosensitive layer. Thus, the printing plate having the cover film was obtained.

After the printing plate was stored at a dark place for 3 days, the surface of the photosensitive layer was matted by the transformation of the matte shape in the surface of the polyester film when the polyester film was peeled off. Then, the photosensitive layer was exposed for 3 minutes by a chemical lamp by using the same negative film as used in Example 1. After the exposure, the printing plate was developed for 2 minutes by using a neutral water spray developing apparatus at a liquid temperature of 35° C. under a spray pressure of 4 kg/cm$^2$.

As a result of the evaluation of the relief image thus obtained, up to 17 steps remained in the gray scale portions, by which the high sensitivity of the printing plate was indicated. Furthermore, it was confirmed that the 3% halftone, 200 μm independent dot and 50 μm fine line were satisfactorily reproduced in the image portions. The hardness of the printing plate was a Shore D of 75.

I claim:

1. A printing plate comprising a photosensitive polymer composition layered on a support, said photosensitive composition comprising:

A. 100 parts by weight of partially saponified polyvinyl acetate having recurring units consisting essentially of

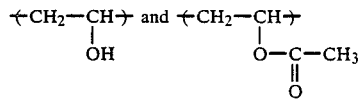

and a saponification degree of 60 to 99 mole %;

B. 20 to 200 parts by weight of polyfunctional acrylate or methacrylate having a molecular weight of not more than 2000 and having at least two acryloyl or methacryloyl groups in the same molecule and a number of hydroxyl group or groups not more than the number of acryloyl and methacryloyl groups in the same molecule, said polyfunctional acrylate or methacrylate being selected from the group consisting of:

(a) a polyfunctional acrylate or polyfunctional methacrylate derived from the reaction of acrylic acid or methacrylic acid with the glycidyl ether of a polyhydric alcohol having 2 to 30 carbon atoms and 2 to 5 hydroxyl groups;

(b) a polyfunctional acrylate or polyfunctional methacrylate derived from the reaction of β-hydroxyethyl acrylate or β-hydroxyethyl methacrylate with the glycidyl ether of a polyfunctional alcohol having 2 to 30 carbon atoms and 2 to 5 hydroxyl groups;

C. 1 to 60 parts by weight of a saturated compound capable of improving the compatibility of component A with component B, said saturataed compound having a molecular weight of not more than 1000 and a boiling point of not less than 150° C. and having at least one hydroxyl group in the molecule thereof; and D. 0.01 to 10% by weight, based on the total weight of the composition, of a photosensitizer.

2. A printing plate as claimed in claim 1, wherein the saponification degree of the partially saponified polyvinyl acetate of component A is 70 to 90 mole %.

3. A printing plate as claimed in claim 1, wherein the polymerization degree of the partially saponified polyvinyl acetate of component A is 200 to 2000.

4. A printing plate as claimed in claim 1, wherein the partially saponified polyvinyl acetate of the component A further consists essentially of 1 to 10 mole % of allyl sulfonate copolymerized therewith.

5. A printing plate as claimed in claim 1, wherein component A is a partially saponified polyvinyl acetate containing therein 1% of 20% by weight, based on the weight of the partially saponified polyvinyl acetate, of at least one compound selected from the group consisting of cellulose derivatives, polyethylene oxides, the ring opening polymers of $\alpha$-(N-dimethylamino)-$\epsilon$-caprolactam, and the ring opening copolymers of $\alpha$-(N-dimethylamino)-$\epsilon$-caprolactam and $\epsilon$-caprolactam.

6. A printing plate as claimed in claim 1 wherein the amount of component B in the composition is 50 to 150 parts by weight, based on 100 parts by weight of component A.

7. A printing plate as claimed in claim 1 wherein component C is a compound having two or more hydroxyl groups in the molecule thereof.

8. A printing plate as claimed in claim 7, wherein the compound having 2 or more hydroxyl groups is at least one member selected from the group consisting of ethylene glycol, diethylene glycol, triethylene glycol, glycerine, diglycerine, trimethylol-propane, and trimethylol-ethane.

9. A printing plate claimed in claim 1, wherein component C is n-octyl alcohol.

10. A printing plate as claimed in claim 1, wherein the amount of component C in the composition is 5 to 50 parts by weight, based on 100 parts by weight of component A.

* * * * *